United States Patent [19]
Petree

[11] 3,988,815
[45] Nov. 2, 1976

[54] APPARATUS FOR TERMINATING A CABLE

[75] Inventor: Edwyn H. Petree, Burlington, N.C.

[73] Assignee: Western Electric Company, Inc., New York, N.Y.

[22] Filed: Sept. 29, 1975

[21] Appl. No.: 617,890

[52] U.S. Cl. .............................. 29/33 K; 29/203 B; 29/427; 29/628; 81/9.51
[51] Int. Cl.² .......................................... H05K 3/34
[58] Field of Search ...... 29/203 B, 203 MW, 203 D, 29/203 DT, 203 C, 628, 427, 203 J, 33 K, 33 M; 81/9.51, 9.5 R

[56] References Cited

UNITED STATES PATENTS

| | | | |
|---|---|---|---|
| 2,691,817 | 10/1954 | Rainone et al. | 29/235 |
| 3,706,241 | 12/1972 | Balmer et al. | 81/9.51 |
| 3,810,289 | 5/1974 | Hannabery | 29/203 D |
| 3,848,316 | 11/1974 | Bakermans et al. | 29/203 DTS |
| 3,916,516 | 11/1975 | Harms et al. | 29/628 |
| 3,916,733 | 11/1975 | Meadows | 81/9.51 |

*Primary Examiner*—James R. Duzan
*Attorney, Agent, or Firm*—R. P. Miller

[57] ABSTRACT

To prepare insulated conductors of a cable for termination to a connector of the type including a planar member through which a plurality of conductor receiving passageways extend in a predetermined multiplanar array, the conductors are gripped, at a point spaced from the ends thereof, between a pair of conductor holders. The conductor holders each have a plurality of teeth which intermesh when urged together to grip the conductors in an array which spatially corresponds with the predetermined array of the conductor receiving passageways. The conductor holders position the ends of the conductors between a pair of stripping blades each of which has a plurality of insulation cutting teeth which intermesh when urged together to sever the insulation on the conductors at a point between the ends thereof and the conductor holders, and to capture the conductors in the predetermined array. A cutting blade severs the conductors at a point between the ends thereof and the stripping blades, and the stripping blades are then moved parallel to the conductors and away from the conductor holders to strip the insulation from the ends of the conductors. While the conductors are still held by the conductor holders in the predetermined array, the connector may be positioned on the conductors with the stripped ends thereof extending through the connector passageways.

6 Claims, 17 Drawing Figures

APPARATUS FOR TERMINATING A CABLE

BACKGROUND OF THE INVENTION

1. Field of the Invention

The present invention relates to a method of and an apparatus for terminating a cable, and in particular to a method and an apparatus for stripping and orienting the ends of insulated conductors of the cable for termination to a connector at points in a multiplanar array.

2. Description of the Prior Art

Known prior art machines for preparing for termination, or for terminating, conductors of cables to printed wiring boards or connectors, where the conductors are to be terminated in a planar array, as well known. For example, U.S. Pat. No. 3,706,241, issued to J. D. Blamer et al., discloses an apparatus for severing and stripping the ends of conductors of a ribbon cable in a planar array, wherein the conductors are extended through and gripped by intermeshing teeth of a pair of jaws. The portion of the conductors extending beyond the jaws is severed to length by a wire cutting blade, and the insulation therearound is nicked by an insulation cutting blade at a point intermediate the jaws and the cutting blade. The conductors are then pulled from between the pair of jaws to strip the insulation therefrom, leaving the stripped conductors in a planar array.

The apparatus disclosed in the Balmer et al. patent is representative of most prior art with respect to the orientation of the conductors to be cut and stripped of insulation; that is, in the Balmer et al patent, as in other prior art wire cutting and stripping apparatus, the cable conductors are oriented in, and operated upon, in a single plane array for termination to points on a printed wiring board, or terminals in a connector, which are similarly in a single plane array.

In many electronic device manufacturing operations, however, it is necessary to terminate cable conductors, or to prepare the conductors for termination, to points on a printed wiring board, or terminals in a connector, which are in a multiplanar array. The aforementioned cable termination apparatus cannot be used in such a case, and heretofore preparation of cable conductors for termination to points in a multiplanar array has been a manual operation, a time consuming and costly procedure.

SUMMARY OF THE INVENTION

In accordance with the present invention, a cable terminating apparatus for preparing a cable of the type including a plurality of insulated conductors for connection to a connector of the type including a plurality of conductor connection points lying in a common plane in a predetermined multiplanar array includes a conductor support for receiving and for supporting individual ones of the cable conductors at a point spaced from the ends thereof in a parallel relationship and in a multiplanar array which spatially corresponds with the predetermined array of the connection points. Also included is an insulation severing device for severing and for gripping the insulation around each of the conductors at a point intermediate the conductor support and the ends of the conductors, a conductor cutting blade for cutting each of the conductors along a common plane perpendicular to the conductors at a point intermediate the insulation severing device and the ends of the conductors, and a mechanism for moving the conductor support and the insulation severing device relative to and away from each other to strip an amount of severed insulation from the end of each of the cut conductors equal to the spacing between the insulation severing device and the point whereat the conductor cutting blade cuts the conductors, whereupon the ends of the conductors supported by the conductor support are stripped of insulation and oriented for connection to the conductor connection points of the connector.

Preferably, the ends of the insulated conductors are oriented and stripped of insulation in preparation for termination to a connector including a planar member through which a plurality of conductor receiving passageways extend in two adjacent and parallel rows, and the conductor support includes a pair of conductor gripping jaws mounted for movement toward and away from each other, each jaw having a plurality of teeth defining conductor receiving channels therebetween, with the teeth on each jaw aligned with the conductor receiving channels on the other jaw for intermeshing entry therewithin upon movement of the jaws toward each other, the teeth and channels being dimensioned to define between the ends thereof, when the jaws are moved toward each other, a plurality of passageways having a spatial orientation corresponding to the spatial orientation of the connector passageways. A first mechanism moves the conductor gripping jaws toward and away from each other, and a conductor holder is positioned adjacent the pair of jaws for releasably holding the conductors and for positioning the conductors, at a point spaced from the ends thereof, alternately before the teeth and the conductor receiving channels of one of the jaws when the jaws are moved away from each other, so that upon movement of the jaws toward each other the teeth of each jaw engage the conductors to force the conductors into the conductor receiving channels of the other jaw to grip the conductors within the passageways defined between the ends of the teeth and the ends of the channels with the ends of the conductors extending essentially in parallel from the jaws in an orientation corresponding to the spatial orientation of the connector passageways. A second mechanism moves the pair of conductor gripping jaws between a first location whereat the conductors are positioned between the jaws and gripped thereby, and a second location remote from the first to transfer the gripped conductors thereto.

The conductor cutting blades include a pair of conductor stripping jaws mounted for movement toward and away from each other and positioned, when moved away from each other, to receive the end portions of the gripped conductors therebetween when the conductor gripping jaws are at the second location, each conductor stripping jaw having a plurality of teeth defining conductor receiving channels therebetween with the teeth on each stripping jaw aligned with the conductor receiving channels on the other stripping jaw for intermeshing entry therewithin when the stripping jaws are moved together, the ends of the teeth and the ends of the channels having insulation cutting edges and the teeth and the channels being aligned and dimensioned to receive individual ones of the conductors within individual ones of the channels upon movement of the stripping jaws together and to sever the insulation surrounding each conductor, between the cutting edges at the ends of the teeth and the cutting edges at the end of the channels, at a point between the conductor gripping jaws and the ends of the conductors, and to capture the conductors in the spatial orientation corresponding to the orientation of the connector passageways. The conductor blade is positioned adjacent the stripping jaws and is mounted for movement through the conductors to sever the conductors along a plane perpendicular to the length of the conductors at a point between the stripping jaws and the end of the conductors, and a third mechanism moves the stripping jaws toward each other, after movement of the gripping jaws to the second location, to sever the insulation surrounding each conductor and to capture the conductors in the orientation corresponding to the spatial orientation of the connector passageways, and then moves the cutting blade through the conductors to sever the conductors. A fourth mechanism thereafter moves the gripping jaws and the stripping jaws relative to and away from each other to pull and to strip the insulation from the ends of the conductors, whereby the ends of the conductors are stripped of insulation and oriented for termination within the conductor receiving passageways of the connector.

Other advantages and features of the invention will be apparent upon consideration of the following detailed description when taken in conjunction with the appended drawings.

Figures 3, 4, 5, 6A, 6B:
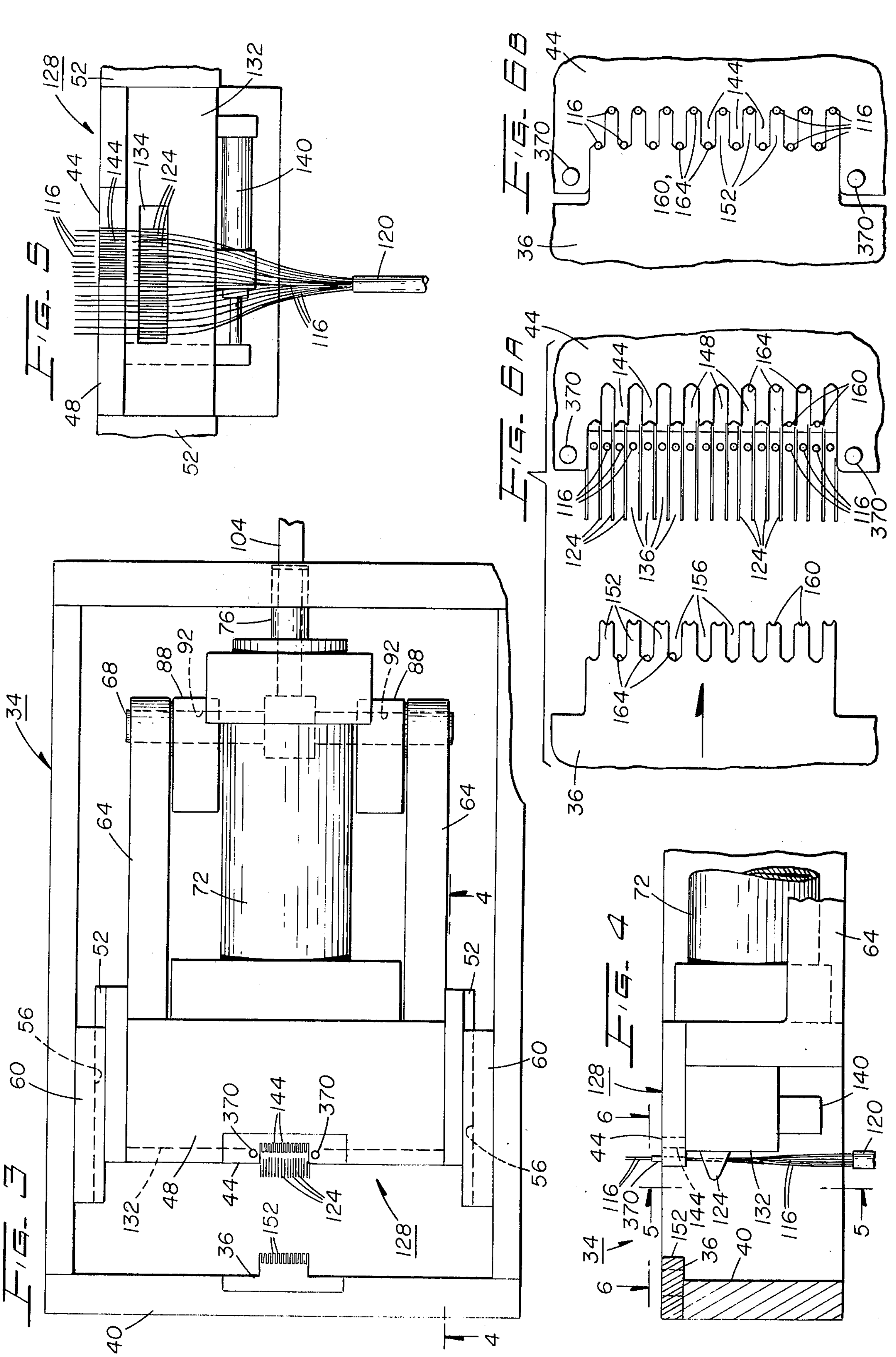
FIG. 3 is taken along the lines 3—3 of FIG. 2, and shows the arrangement of the cable gripping jaws of the apparatus.
FIG. 4 is taken along the lines 4—4 of FIG. 3, and illustrates conductors of a cable positioned to be gripped by the gripping jaws.
FIG. 5 is taken along the lines 5—5 of FIG. 4, and shows the cable conductors supported in front of one of the gripping jaws.
Figure 8:
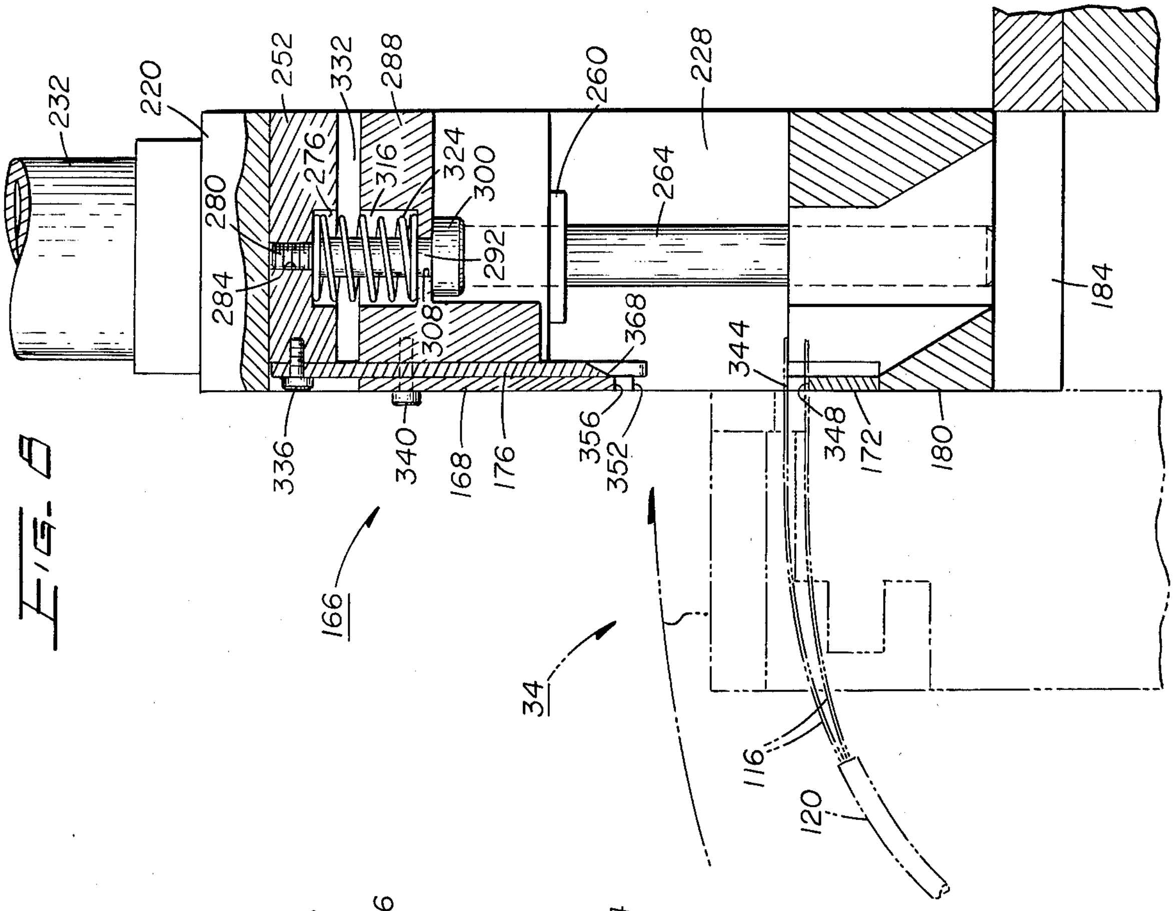
Figure 7:
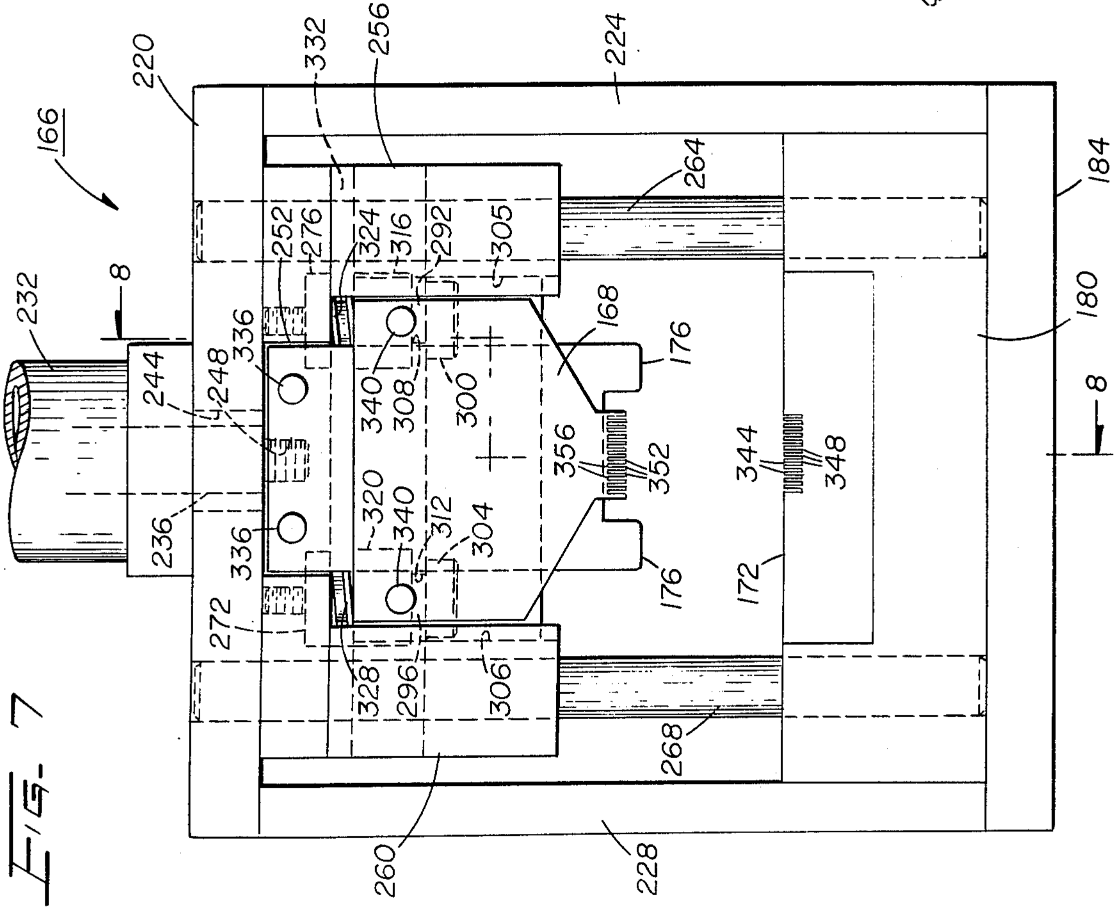
Figure 12:
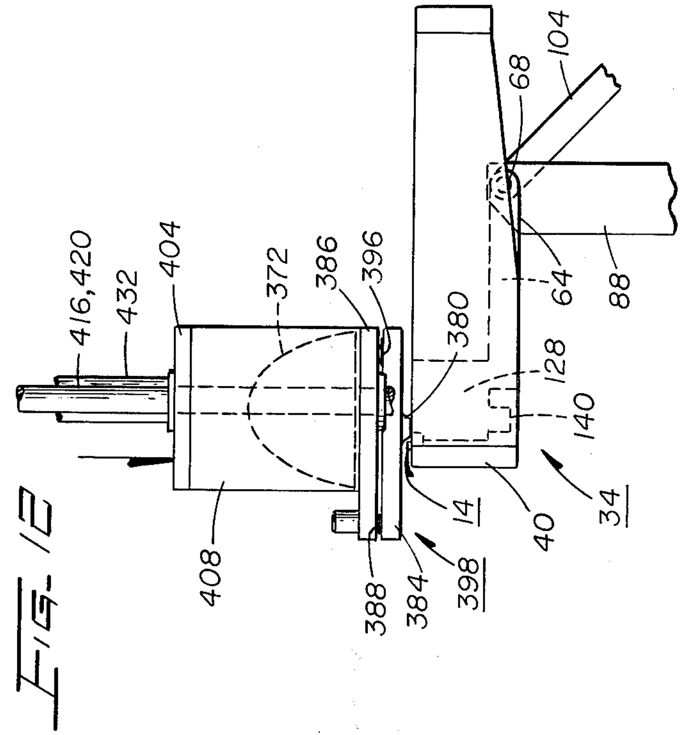
Figure 13:
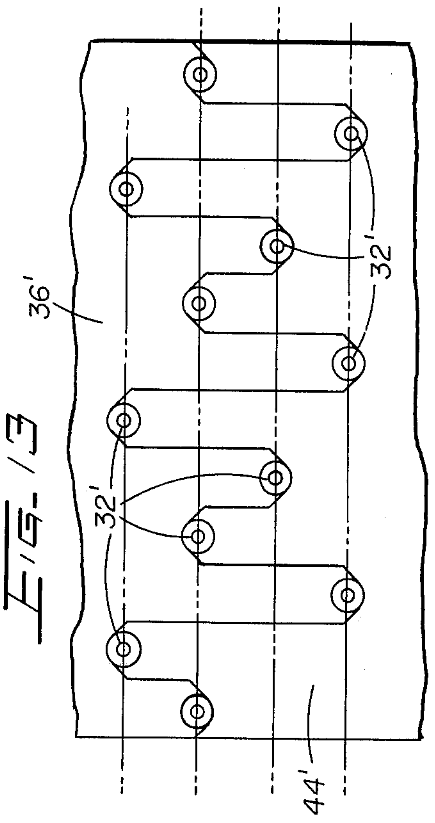
Figure 10:
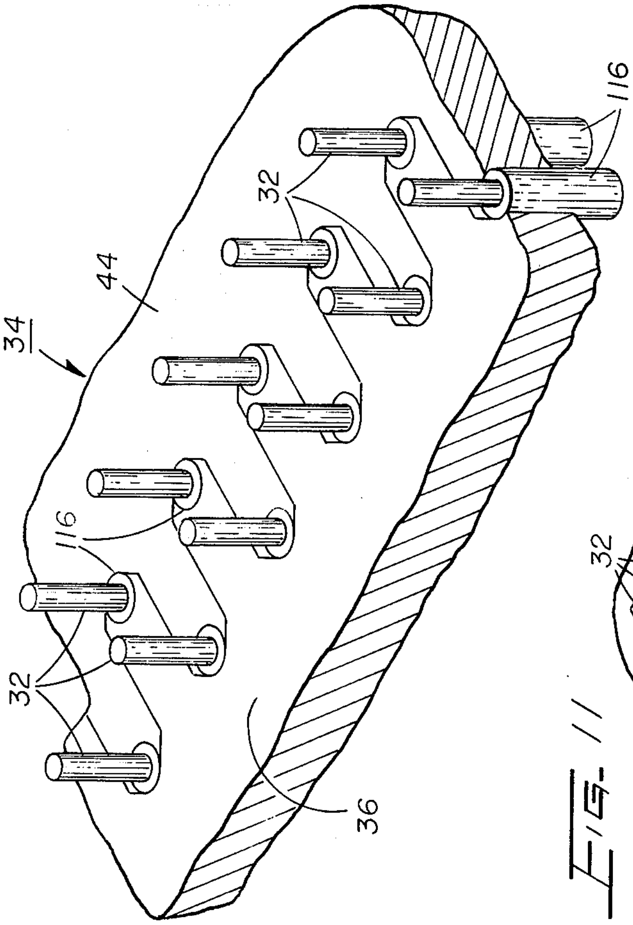
Figure 11:
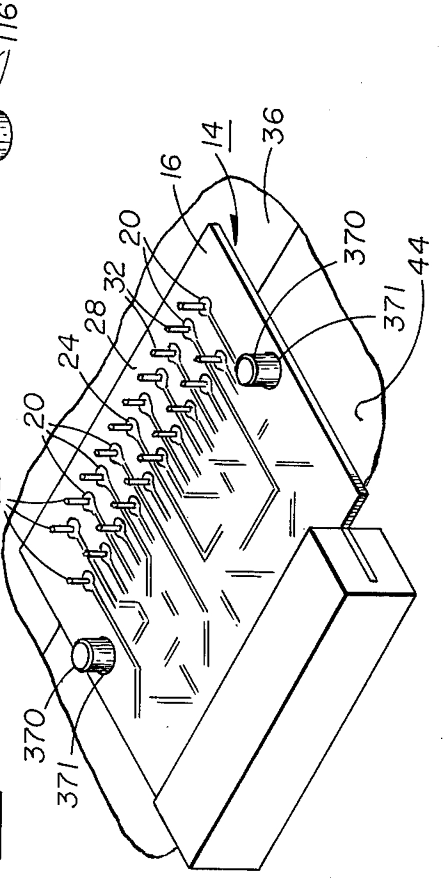

FIGS. *6a* and *6b* are taken along the lines 6—6 of FIG. 4, and show the relative orientation of the cable conductors before and after being gripped by the gripping jaws, with the gripped conductors in two parallel rows;

FIG. 7 is a front view of the conductor insulation severing jaws and the conductor cutting blade portion of the apparatus of the invention;

FIG. 8 is taken along the lines 8—8 of FIG. 7, illustrates conductors positioned by the gripping jaws to be operated upon by the insulation severing jaws and the cutting blade;

FIGS. *9a–9d* illustrate the sequence of operation of the insulation severing jaws and the cutting blade in cutting and stripping the ends of the conductors;

FIG. 10 shows the stripped and cut conductors gripped by the gripping jaws;

FIG. 11 illustrates a connector positioned over the stripped ends of the conductors within the gripping jaws;

FIG. 12 shows the conductors being soldered to connection points on the connector, and FIG. 13 shows an alternate arrangement of the gripping jaws for orienting conductors in more than two planes.

DETAILED DESCRIPTION

The drawings illustrate a cable terminating apparatus for stripping the ends of a plurality of insulated conductors of a cable and for orienting the ends of the conductors in a predetermined multiplanar array to prepare the conductors for termination to a connector of a type having a plurality of conductor connection points lying in a common plane in the predetermined multiplanar array. FIG. 11 shows one connector 14 to which the conductors may be terminated. The connector 14 includes a planar electrically insulating substrate, or member 16, through which a plurality of conductor receiving passageways 20, or conductor connection points, extend in a predetermined, multiplanar or multirow array, which array as shown defines two spaced and parallel rows, or tiers, of passageways. Each hole or passageway 20 is surrounded by a solder coated land area 24 on one surface 28 of the planar member 16. In the use of the apparatus of the invention, the ends of a plurality of insulated conductors of a cable are stripped and oriented in the predetermined array, which spatially corresponds with the array of the conductor receiving passageways through the planar member 16, so that the planar member 16 may be extended over the ends of the conductors with a stripped end 32 of each conductor extending through an individual one of the passageways 20.

Figure 2:
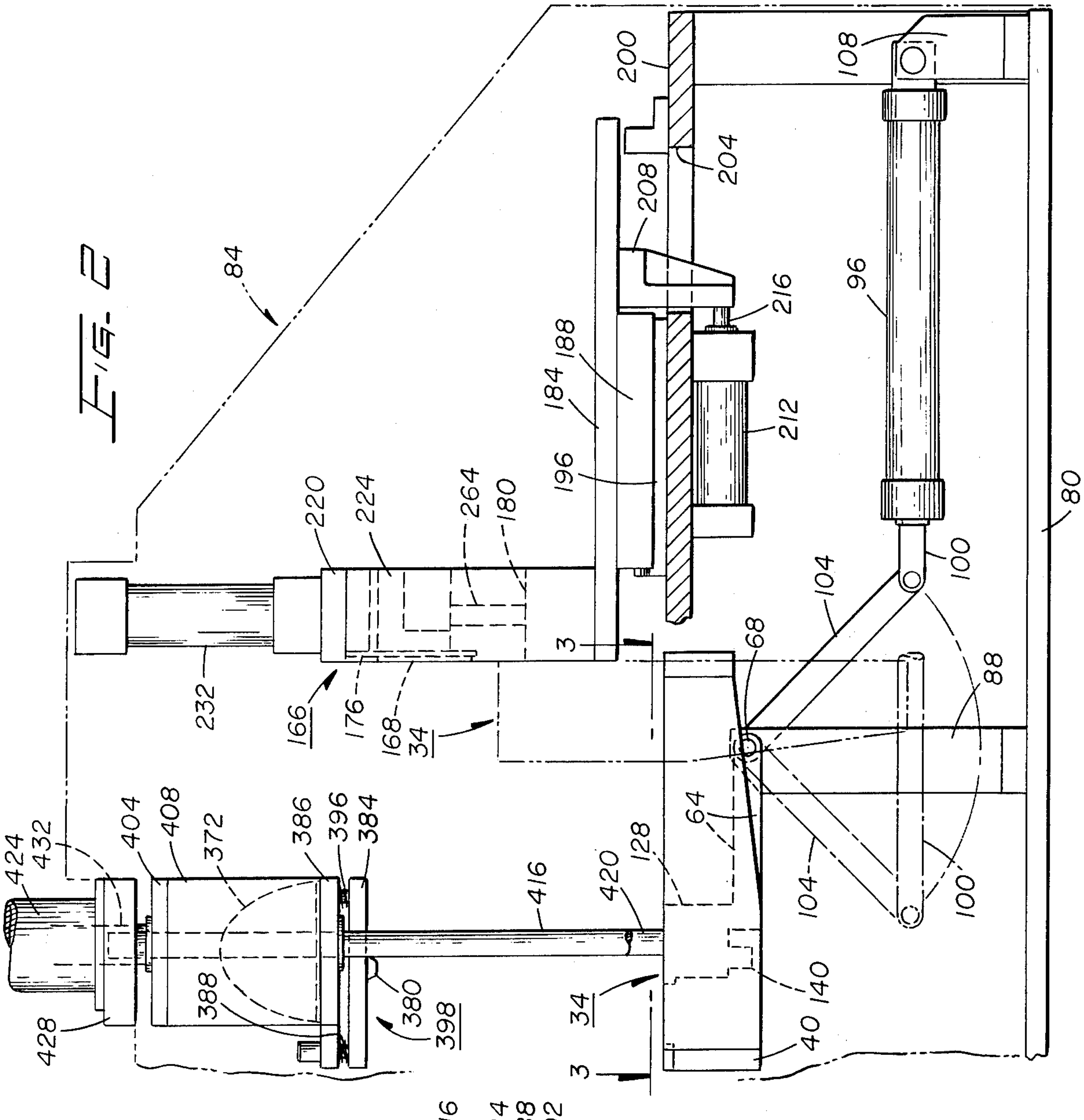
FIG. 2 is a side elevation view of the cable termination apparatus.
Figure 1:
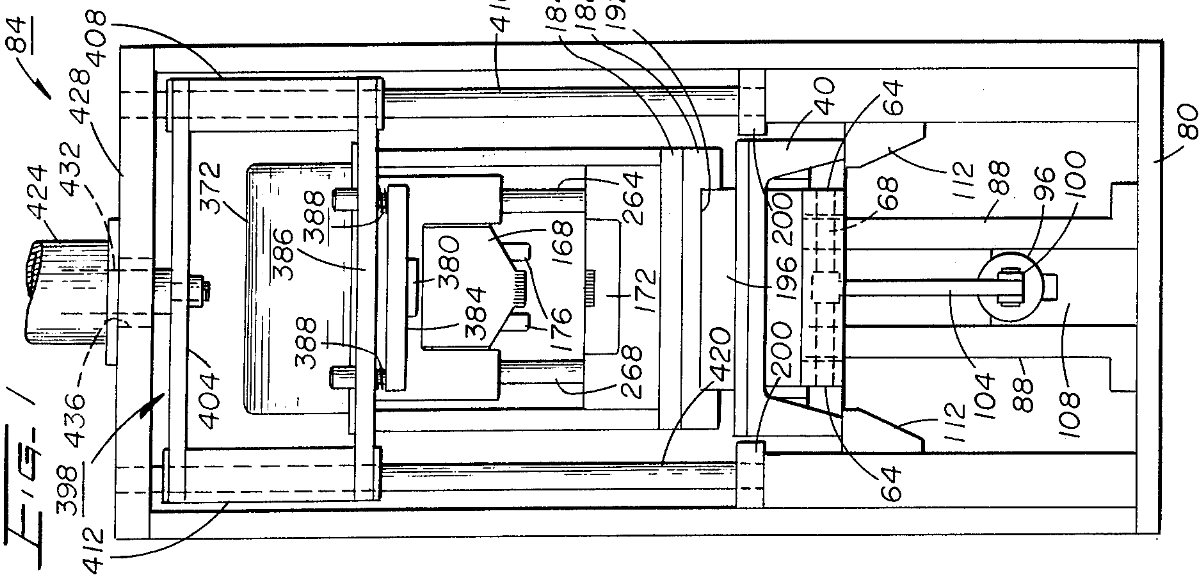
FIG. 1 is a front elevation view of the cable terminating apparatus of the invention.

Referring to FIGS. 1, 2 and 3, and in particular to FIG. 3, the apparatus includes a conductor gripping jaw assembly 34, or conductor holding assembly, having a first conductor gripping member or holding jaw 36 secured within a rectangular shaped frame 40, and a second conductor gripping member or holding jaw 44 secured within a plate 48. A slider member 52 at each end of the plate 48 is slidingly received within a channel 60 formed in a guide 56 on opposite sides of the frame 40 to support the gripping jaws 36 and 44 for movement toward and away from each other. A pair of arms 64 extend in parallel from opposite ends of the plate 48 and are each fixedly secured at the end thereof away from the plate 48 to a shaft 68 extending between the arms 64. A pneumatic cylinder, such as an air cylinder 72, is connected at its base to the plate 48, and a plunger 76 of the cylinder is fastened to the frame 40 opposite from the jaws 36, so that operation of the cylinder 72 moves the jaws 36 and 44 toward or away from each other with the slider members 52 sliding within the channels 56 of the guides 60 and being guided thereby.

The conductor gripping jaw assembly 34 is supported above a base 80 of a frame 84 by a pair of upright supports 88. The upper ends of the supports 88 extend between the connecting arms 64, and a passageway 92 formed through each of the supports 88 slidably the shaft 68. As will be described, in the practice of the invention the conductor gripping jaw assembly 34 is moved between a horizontal position at a first location whereat conductors are received between and gripped by the jaws 36 and 44, and a vertical position to a second remote location, as shown by the phantom lines in FIG. 2, whereat the ends of the conductors are cut to length and stripped of insulation. Movement of the gripping jaw assembly 34 is accomplished with an air cylinder 96 having a plunger 100 rotatably secured to one end of a link arm 104, the other end of which is fixedly secured to the shaft 68. The base of the air cylinder 96, opposite from the plunger 100 thereof, is rotatably secured to a support 108 extending upwardly from the base 80.

With the plunger 100 retracted within the cylinder 96, the gripping jaw assembly 34 is in a horizontal position and rests at its end opposite from the shaft 68 on a pair of stops 112. When the plunger 100 is extended from the cylinder 96, the gripping jaw assembly 34 is rotated to a vertical position about the shaft 68, as shown in phantom lines, as the shaft 68 is rotated through the action of the link arm 104 thereon.

The conductor gripping jaws 36 and 44 are configured, when a plurality of conductors are supportingly extended therebetween in a manner to be described, to capture and to grip the conductors at a point spaced from the ends thereof in a parallel configuration and in an array which spatially corresponds with the array of the passageways 20 on the planar insulating member 16 of the connector 14, with the conductors extending essentially perpendicular to the direction of movement of the jaws 36 and 44 toward and away from each other. Referring to FIGS. 4 and 5, with the conductor gripping jaw assembly 34 in the horizontal position, individual ones of a plurality of insulated conductors 116 of a cable 120 are extended between the gripping jaws 36 and 44 and before the gripping jaw 44 by a plurality of plates 124. The plates 124 are supported within a housing 128 and extend outwardly from a surface 132 thereof through an elongated opening 134 therein in a parallel and side-by-side relationship along a row adjacent to the gripping jaw 44, with adjacent pairs of plates defining conductor receiving and aligning channels 136 therebetween. The plates are movable with respect to each other along the direction of the row by an air cylinder 140 to increase or to decrease the width of the conductor receiving and aligning channels 136 therebetween. To position the conductors 116 within the channels 136 between the plates 124, the cylinder 140 moves the plates in a first direction along the row to increase the width of the channels therebetween, and individual ones of the conductors 116 of the cable 120 are manually inserted within individual ones of the channels 136 with the ends of the conductors extending between and past the gripping jaws 36 and 44. The cylinder 140 then moves the plates 124 in a second and opposite direction along the row to decrease the width of the channels 136 therebetween to grip the conductors 116 essentially in a single plane within the channels between adjacent plates 124 to position, as shown in FIG. *6a* , the conductors before the conductor gripping jaw 44.

As shown in FIGS. *6a* and *6b* , the conductor gripping jaw 44 has a plurality of teeth 144 which define conductor receiving channels 148 therebetween. The conductor gripping jaw 36 similarly has a plurality of teeth 152 which also define conductor receiving channels 156 therebetween. Each of the teeth 144 and 152 has a recessed area 160 formed at the end thereof, and each of the conductor receiving channels 148 and 156 has a recessed area 164 formed at an innermost end thereof. The teeth on each jaw are aligned with the conductor receiving channels on the other jaw for intermeshing entry therewithin upon movement of the jaws toward each other, and the teeth have a spacing with respect to each other and a length, and the channels have a depth, to define when the jaws are moved together a plurality of passageways, between the recessed areas at the end of the teeth and at the ends of the conductor receiving channels, in an array, or orientation, spatially corresponding with the orientation of the passageways 20 of the connector 14. As described, the teeth of the conductor gripping jaws 36 and 44 may be considered to be projecting jaws, and the channels thereof may be considered to be recessed jaws, for cooperating to grip conductors therebetween, with the projecting jaws spaced from the recessed jaws a distance equal to the spacing between the two tiers of holes 20 formed in the substrate 16.

The plates 124 are arranged, when moved in the direction to grip the conductors 116 therebetween, to position the conductors essentially in a single plane alternately before the teeth 144 and conductor receiving channels 148 of the jaw 44 with the lateral spacing between the teeth corresponding to the lateral spacing between the passageways 20 in both tiers on the substrate 16, with the length of the conductors extending essentially perpendicular to the direction of movement of the jaws 36 and 44 toward and away from each other. With the conductors so positioned, upon movement of the conductor gripping jaws 36 and 44 toward each other under the urging of the air cylinder 72 the teeth of each jaw engage alternate conductors to displace and to force the conductors into the conductor receiving channels of the other jaw as the teeth intermeshingly enter therewithin, and to grip the conductors along a common plane essentially perpendicular to the axes of the wires at a point spaced from the ends thereof between the ends of the teeth and the ends of the conductor receiving channels and within the passageways defined by the recessed area 160 and 164 thereat, with the conductors 116 extending essentially in parallel through and from the jaws in an array, or orientation, which spatially corresponds with the orientation of the conductor receiving passageways 20 of the connector 14. With the conductors so gripped between the gripping jaws 36 and 44, the cylinder 96 rotates the gripping jaw assembly 34 from the horizontal position at the first location to the vertical position at the second location to transfer the gripped conductors to the second location whereat the ends of the conductors are stripped and cut to length.

A mechanism 166 for stripping the ends of the conductors and for severing or cutting the conductors to a predetermined length includes as shown in FIGS. 1, 2, 7 and 8, a first insulation stripping jaw, or blade 168, a second insulation stripping jaw, or blade 172, and a conductor cutting blade 176. The second insulation stripping jaw 172 is secured within a plate 180 supported on a base 184. The base 184 is carried on a slider block 188 having a U-shaped channel 192 formed therein which slidingly receives therewithin a guide block 196. The guide block 196 is in turn carried on a table 200 having an opening 204 formed therethrough through which an arm 208, secured at its upper end to the lower surface of the base 184, extends. An air cylinder 212 is mounted to the lower surface of the table 200 and has a plunger 216 attached to the lower end of the arm 208 to move the base 184, and therefore the conductor cutting and stripping mechanism 166, toward and away from the second location.

Referring particularly to FIGS. 7 and 8, a horizontal plate 220 is carried above the base 184 on a pair of vertical supports 224 and 228. An air cylinder 232 is mounted on an upper surface of the plate 220, and a plunger 236 thereof extends downwardly through a passageway 244 formed through the plate 220 for attachment to a cutter blade carrying block 252. The cutter blade carrying block 252 has a pair of sleeves 256 and 260 on opposite sides thereof slidably surrounding guide shafts 264 and 268, respectively, which extend between the base 184 and the horizontal plate 220 for guiding the conductor blade carrying block 252 in a vertical direction upon actuation of the air cylinder 232. A pair of cavities 272 and 276 are formed in the lower surface of the cutter blade carrying block 252, and each have extending therewithin a threaded stud which is received within a threaded passageway of the conductor blade carrying block 252, such as the threaded stud 280 received within the threaded passageway 284 and extending within the cavity 276.

A stripper blade carrying block 288 is movably secured to the cutter blade carrying block 252 by a pair of threaded sleeves 292 and 296 having expanded diameter head portions 300 and 304, respectively, and is slidably received at its sides with guide channels 305 and 306 formed within the sleeves 256 and 260, respectively. The threaded sleeves 292 and 296 slidably extend both through passageways 308 and 312 formed through the stipper blade carrying block 288 and through cavities 316 and 320 formed in the block 288, and into threading engagement with the threaded studs within the cavities 272 and 276. A spring 324 is maintained under compression around the sleeve 292 within and between the cavity 276 in the cutter blade carrying block 252 and the cavity 316 in the stripper blade carrying block 288, and a spring 328 is similarly maintained under compression around the sleeve 296 within and between the cavity 272 formed in the cutter blade carrying block 252 and the cavity 320 formed in the stripper blade carrying block 288. The springs 324 and 328 urge the blocks 252 and 288 apart, with a lower surface of the block 288 forced against the head portions 300 and 304 of the threaded sleeves 292 and 296. The length of the sleeves 292 and 296 are selected to define between the lower surface of the cutter blade carrying block 252 and the upper surface of the stripper blade carrying block 288 a gap 332.

The conductor cutting blade 176 is secured to the cutter blade carrying block 252 by a pair of fasteners 336. The insulation severing jaw 168 is slidably positioned against the conductor cutting blade 176 secured to the stripper blade carrying block 288 by a pair of fasteners 340 which extend through vertical slots (not shown) in the conductor cutting blade 176, which slots allow relative movement between the insulation severing jaw 168 and the conductor cutting blade 176 upon movement of the blocks 252 and 288 with respect to each other. The insulation severing jaw 172 has a plurality of teeth 344 which define conductor receiving channels 348 therebetween. Similarly, the insulation severing jaw 168 has a plurality of teeth 352 which define conductor receiving channels 356 therebetween. The teeth on each of the insulation severing jaws 168 and 172 are aligned with the conductor receiving channels on the other stripping jaw for intermeshing entry therewithin when the stripping jaws are moved together by the cylinder 232. With the plunger 216 retracted within the cylinder 212 to position the insulation severing jaws 168 and 172 adjacent the second location, the teeth 344 of the insulation stripping jaw 172 are aligned with the teeth 144 of the conductor gripping jaw 44 and the teeth 152 of the conductor gripping jaw 36 to receive within the conductor receiving channels 348 alternate ones of the conductors 116 when the conductor gripping jaw assembly 34 is moved to the second location, and to have positioned above the teeth 344 the remaining alternate ones of the conductors 116.

In the use of the apparatus of the invention to prepare the ends of the insulated conductors 116 of the cable 120 for termination within the passageways 20 of the connector 14, and with the conductors 116 received between and gripped by the pair of conductor gripping jaws 36 and 44 in the manner previously described, the cylinder 96 rotates, or moves, the conductor gripping jaw assembly 34 to the second location to extend the ends of alternate ones of the insulated conductors 116 through individual ones of the conductor receiving channels 348 of the insulation severing jaws 172, and to position the remaining alternate ones of the insulated conductors 116 above individual ones of the teeth 344 of the insulation severing jaw 172, as shown in FIGS. 8 and **9*a*–9*d*. With the conductors 116 so positioned with respect to the insulation severing jaw 172, the cylinder 232 moves the insulation severing jaw 168 and the conductor cutting blade 176 toward the insulation severing jaw 172 until the teeth of the insulation severing jaws 172 and 176 engage the conductors 116 and intermesh to capture the conductors between the ends thereof and the innermost ends of the conductor receiving channels. The teeth 344 and 352 of the insulation severing jaws 172 and 168 have a length, and the conductor receiving channels 348 and 356 have a depth, to capture the conductors 116 in the array which spatially corresponds with the orientation of the passageways 20 through the connector 14, with the conductors 116 extending along their length in a direction essentially perpendicular to the direction of movement of the jaws 168 and 172** toward and away from each other.

Referring particularly to FIGS. **9*a*–9*d*, which illustrate the sequence of operation of the insulation severing jaws 168 and 172, and of the conductor cutting blade 176, in stripping and cutting the ends of the conductors 116, the teeth 352 and 344 of the insulation severing jaws 168 and 172 each have formed at an extreme end thereof a concave shaped insulation cutting edge 360. Similarly, each of the conductor receiving channels 348 and 356 of the insulation severing blades 168 and 172 each have formed at the innermost end thereof a concave shaped insulation severing edge 364. The conductor cutting blade 176 has a conductor cutting edge 368 formed at a lower end thereof, and the insulation severing jaw 168 and the conductor cutting blade 176 are positioned with respect to each other, when the insulation severing jaws 168 and 172 are moved away from each other, such that the conductor cutting edge 368 is above the innermost end portions of the conductor receiving channels 356 of the conductor severing jaws 168.**

When the conductor gripping jaw assembly 34 is initially moved to the second location, the ends of the conductors extending therefrom are positioned, as partially shown in FIG. **9*a*, with the ends of alternate ones of the conductors 116 extending through the conductor receiving channels 348 of the insulation severing jaw 172, and with the remaining alternate conductors 116 positioned above the ends of individual ones of the teeth 344 of the jaws 172. The cylinder 232 then moves both the insulation severing jaw 168 and the conductor cutting blade 176 downwardly, in synchronism, to intermesh the teeth of the insulation severing jaws 168 and 172 to capture the conductors 116 at a point spaced from the ends thereof in the predetermined orientation, which spatially corresponds with the orientation of the passageways 20 formed through the connector 14, between the ends of the teeth and the ends of the channels of the insulation severing jaws 168 and 172, and to sever and grip the insulation surrounding each of the conductors 116 along a common plane essentially perpendicular to the axes of the wires at the point spaced from the ends thereof between the insulation severing edges 364 at the ends of the conductor receiving channels 348 and 356 and the insulation severing edges 360 at the ends of the teeth 344 and 352 which intermeshingly enter the conductor receiving channels. As shown in FIG. 9***b*, since the conductor cutting edge 368 of the conductor cutting blade 176 is positioned vertically above the innermost ends of the conductor receiving channels 356 of the insulation severing jaw 168, the cutting edge 368 is positioned above the conductors 116 and out of contact therewith at the time the insulation therearound is severed by the jaws 168 and 172.

Figure 9D:
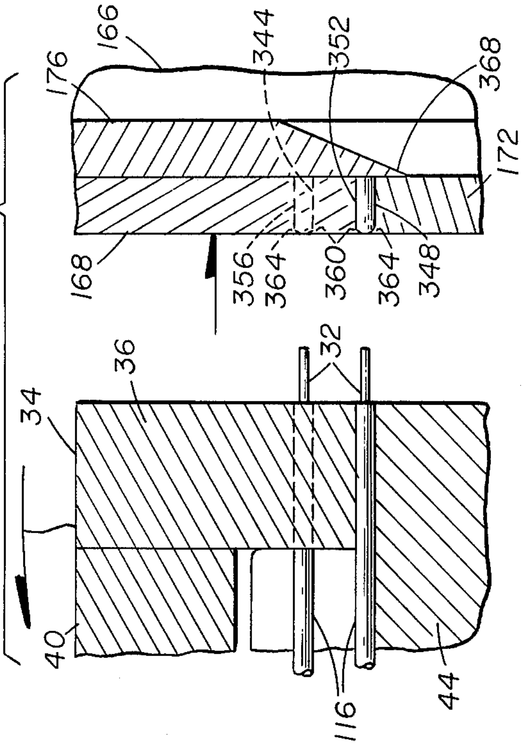
Figure 9C:
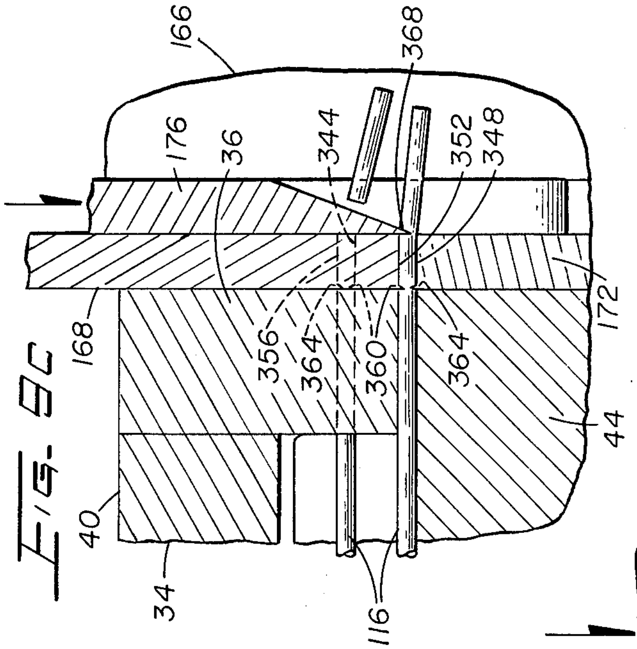
Figure 9B:
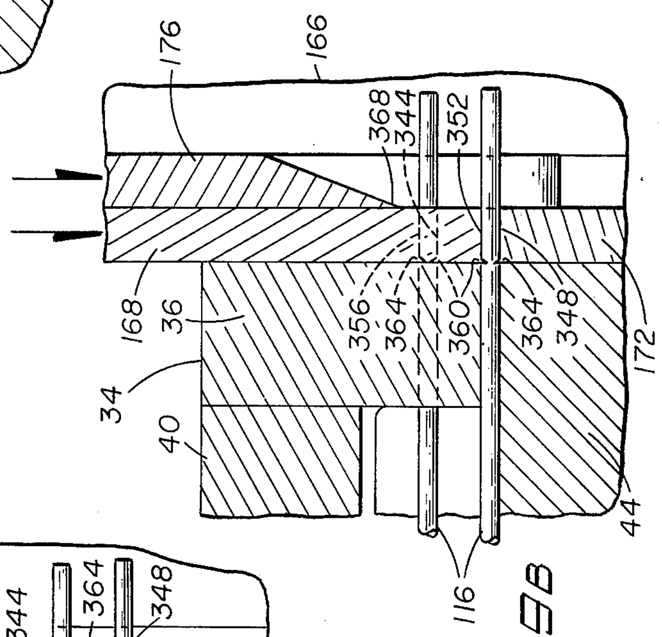
Figure 9A:
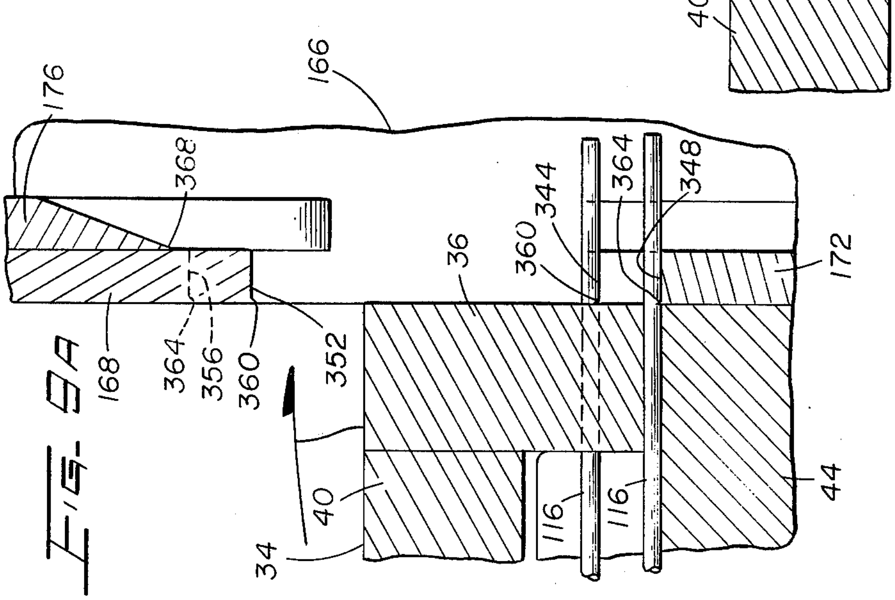

When the teeth of the insulation severing jaws 168 and 172 intermesh and sever the insulation surrounding each of the conductors 116, downward movement of the insulation stripping jaw 168 is arrested. When this occurs, continued downward movement of the cutter blade carrying block 252 by the cylinder 232 moves the cutter blade carrying block through the gap 332, against the urging of the springs 324 and 328, to move the conductor cutting blade 176 downwardly, slidably along the jaw 168, to sever with the conductor cutting edge 368, as shown in FIG. 9c, the conductors 116 extending beyond the insulation severing jaws 168 and 172 at a point spaced from the ends thereof and along a common plane extending essentially perpendicular to the length of the conductors. The cylinder 212 then moves the base 184, and therefore the insulation severing jaws 168 and 172, relative to and away from the conductor gripping jaws 36 and 44, as shown in FIG. 9*d*, in a direction essentially parallel to the length of the conductors 116 to pull, or strip, the severed insulation from the ends of the conductors 116, leaving skinned ends 32. It is to be noted that the length of the skinned end 32 of each of the conductors 116 is equal to the spacing between the insulation severing edges, or blades, 360 and 364 on the insulation severing jaws 168 and 172, and the conductor cutting edge 368 of the conductor cutting blade 176, which spacing is essentially equal to the thickness of the insulation severing jaws 168 and 172.

After the insulation is stripped from the ends of the conductors 116, the conductor gripping jaw assembly 34, with the stripped and oriented conductors gripped therewithin is moved back to the horizontal position at the first location by the cylinder 96 to allow the connector 14 to be assembled or placed over the skinned ends 32 of the conductors 116 with the skinned ends 32 of the conductors extending through individual ones of the conductor receiving passageways 20 through the planar member 16. To orient the connector 14 for termination to the conductors, a pair of guide pins 370 on the gripping jaw 44 are received within orienting holes 371 formed through the substrate 16 of the connector 14. FIG. 10 illustrates the orientation of the skinned ends 32 of the conductors 116 within the conductor gripping jaw assembly 34, and FIG. 11 illustrates the skinned ends 32 of the conductors extending through the passageways 20 after the connector 14 is placed over the ends of the conductors. To securely terminate the skinned ends 32 of the conductors 116 to the connector 14, the ends 32 of the conductors 116 are folded over the solder coated land areas 24, with any suitable tool, and are soldered thereto.

A mechanism suitable for soldering the skinned ends 32 of the conductors 116 to the land areas 24 is shown in FIGS. 1, 2 and 12, and includes a source of infrared heating radiation 372 focused onto a solder bar 380 to heat the bar to at least the melting point of solder. The soldering bar 380 is secured to a plate 384 suspended beneath, and mounted for movement toward and away from, a base 386 by a pair of pins 388 slidably captured to the base 386. A pair of compensator springs 396 are positioned around the pins 388 and extend between the base 386 and the plate 384. A carriage 398, which includes the base 386, an upper plate 404, and a pair of sleeves 408 and 412 extending between the ends of the base 386 and the plate 404 and slidably around a pair of guide shafts 416 and 420 for guiding the vertical movement of the carriage, supports the source of radiation 372 on the base 386 thereof. An air cylinder 424 is secured to a cross member 428 of the frame 84, and has a plunger 432 extending downwardly through a passageway 436 in the cross member 428 and secured to the upper plate 404 for moving the soldering bar 380 in the vertical direction.

The soldering mechanism is aligned, with the gripping jaw mechanism 34 in the horizontal position and with the skinned and oriented ends 32 of the conductors 116 extended through the conductor receiving passageways 20, to engage and heat the solder coated land areas 24 with the soldering bar 380 upon movement of the soldering bar 380 downward by the cylinder 424. During the soldering operation, the compensator springs 396 compensate for irregular surface conditions engaged by the soldering bar 380. Upon completion of the soldering operation, the cylinder 424 moves the soldering mechanism to its original position vertically spaced above the connector 14, and the cylinder 72 moves the jaws 36 and 44 away from each other to release the terminated cable for removal from therebetween.

FIG. 13 is shown to illustrate another possible configuration of the gripping jaws 36 and 44, wherein the conductors gripped thereby are oriented in a multiplanar array of more than two planes, or tiers.

While one particular embodiment of the invention has been described in detail, various other embodiments and modifications thereof may be devised by one skilled in the art without departing from the spirit an scope of the invention.

I claim:

1. In an apparatus for orienting the ends of a plurality of insulated conductors, and for stripping a section of insulation from an end portion of each conductor to prepare the conductors for termination at their ends of a connector of a type including a planar member through which a plurality of conductor receiving passageways extend in two adjacent and parallel rows:

a pair of conductor gripping jaws mounted for movement toward and away from each other, each jaw having a plurality of teeth defining conductor receiving channels therebetween, with the teeth on each jaw aligned with the conductor receiving channels on the other jaw for intermeshing entry therewithin upon movement of the jaws toward each other, the teeth and channels being dimensioned to define between the ends thereof, when the jaws are moved toward each other, a plurality of passageways having a spatial orientation corresponding to the spatial orientation of the connector passageways;

means for moving the conductor gripping jaws toward and away from each other;

conductor holding means, positioned adjacent the pair of jaws for releasably holding the conductors and for positioning the conductors, at a point spaced from the ends thereof, alternately before the teeth and the conductor receiving channels of one of the jaws when the jaws are moved away from each other, so that upon movement of the jaws toward each other the teeth of each jaw engage the conductors to force the conductors into the conductor receiving channels of the other jaw and to grip the conductors within the passageways defined between the ends of the teeth and the ends of the channels with the ends of the conductors extending essentially in parallel from the jaws in an orientation corresponding to the spatial orientation of the connector passageways;

means for moving the pair of conductor gripping jaws between a first location whereat the conductors are positioned between the jaws and gripped thereby, and a second location remote from the first to transfer the gripped conductors thereto;

a pair of conductor stripping jaws mounted for movement toward and away from each other and positioned, when moved away from each other, to receive the end portions of the gripped conductors therebetween when the conductor gripping jaws are at the second location, each conductor stripping jaw having a plurality of teeth defining conductor receiving channels therebetween with the teeth on each stripping jaw aligned with the conductor receiving channels on the other stripping jaw for intermeshing entry therewithin when the stripping jaws are moved together, the ends of the teeth and the ends of the channels having insulation cutting edges and the teeth and the channels being aligned and dimensioned to receive individual ones of the conductors within individual ones of the channels upon movement of the stripping jaws together and to sever the insulation surrounding each conductor, between the cutting edges at the ends of the teeth and the cutting edges at the ends of the channels, at a point between the conductor gripping jaws and the ends of the conductors, and to capture the conductors in the spatial orientation corresponding to the orientation of the connector passageways;

a conductor cutting blade, positioned adjacent the stripping jaws and mounted for movement through the conductors to sever the conductors along a plane perpendicular to the length of the conductors at a point between the stripping jaws and the ends of the conductors;

means for moving the stripping jaws toward each other after movement of the gripping jaws to the second location to sever the insulation surrounding each conductor and to capture the conductors in the orientation corresponding to the spatial orientation of the connector passageways, and to then move the cutting blade through the conductors to sever the conductors, and means for moving the gripping jaws and the stripping jaws relative to and away from each other, after movement of the cutting blade to sever the conductors, to pull and strip the insulation from the ends of the conductors, whereby the ends of the conductors are stripped of insulation and oriented for termination within the conductor receiving passageways of the connector.

2. In an apparatus as set in claim 1, wherein the conductor holding means includes:

a plurality of plates positioned in a parallel and side-by-side relationship along a row adjacent to the pair of gripping jaws, adjacent pairs of plates defining conductor receiving and aligning channels therebetween, and the plates being movable with respect to each other along the direction of the row to increase to decrease the width of the channels therebetween, and means for moving the plates along the row in a first direction to increase the width of the channels therebetween to facilitate receiving individual ones of the conductors therewithin, and for then moving the plates along the row in a second and opposite direction to decrease the width of the channels therebetween to grip the conductors between adjacent plates and to position the conductors alternately before the teeth and conductor receiving channels of the one of the jaws.

3. In an apparatus as set forth in claim 2, wherein:

the conductors extend through the gripping jaws in a direction essentially perpendicular to the direction of movement of the gripping jaws toward and away from each other;

the conductors extend through the stripping jaws in a direction essentially perpendicular to the direction of movement of the stripping jaws toward and away from each other, and the means for moving the gripping jaws and the stripping jaws relative to and away from each other moves the stripping jaws away from the gripping jaws in a direction parallel to the conductors and toward the ends thereof.

4. In an apparatus as set forth in claim 9, wherein the means for moving the stripping jaws and the cutting blade initially simultaneously moves the stripping jaws toward each other and the cutting blade toward the conductors until the insulation around the conductors is severed and the conductors are captured, and then moves the cutting blade through the conductors upon completion of the movement of the stripping jaws toward each other.

5. An apparatus for facilitating the assembly of an array of insulated wires into two spaced tiers of holes formed in a substrate, which comprises:

a first gripping member having a first group of projecting first jaws and a second group of recessed second jaws, wherein the first jaws are spaced from the second jaws a distance equal to the spacing between the two tiers of holes formed in the substrate;

a second gripping member having a third group of projecting third jaws aligned with the recessed second jaws and a fourth group of recessed fourth jaws aligned with the projecting first jaws, wherein the third jaws are spaced from the fourth jaws a distance equal to the spacing between the two tiers of holes;

means for receiving and spreading the wires in a common plane with the lateral spacing between the wires corresponding to the lateral spacing between the holes in both tiers, and for positioning the wires with alternate ones of the wires aligned with the first group of projecting first jaws of the first gripping member and with the remaining alternate ones of the wires aligned with the second group of recessed second jaws of the first gripping member and with the ends of the wires projecting beyond the gripping members;

means for imparting relative movement between the first and second gripping members to move the jaws to grip and position the wires in two tiers corresponding to the position of the holes in the substrate;

means having a spaced pair of opposed insulation gripping jaws, each jaw having a set of teeth corresponding in length to the lengths of the projecting gripping jaws, and with channels between the teeth corresponding in depth to the recessed gripping jaws;

insulation cutting surfaces formed on the forward edges of the insulation gripping teeth;

means for moving the insulation gripping jaws toward each other to grip the wire and sever the insulation on the wires; and means for imparting relative movement between (1) said first and second gripping members and (2) the insulation gripping jaws to strip the insulation from the two tiers of gripped wires and position the stripped ends of the wires so that a substrate may be mounted thereon with ends of the wires projecting into the holes of the substrate.

6. An apparatus as defined in claim 5, wherein the substrate is provided with solder coated land areas about the two tiers of holes, which comprises:

a heated soldering bar spaced from and aligned with said first and second gripping members when said first and second gripping members are moved away from the insulation gripping and stripping jaws and a substrate is mounted on the stripped ends of the wires; and means for movably mounting said solder bar to move into position to melt the solder on the aligned solder coated land areas of a substrate moved into alignment with the solder bar.

* * * * *

UNITED STATES PATENT OFFICE
CERTIFICATE OF CORRECTION

Patent No. 3,988,815 Dated November 2, 1976

Inventor(s) Edwyn H. Petree

It is certified that error appears in the above-identified patent and that said Letters Patent are hereby corrected as shown below:

In the specification, Column 3, line 46, after "conductors", insert --oriented--; Column 3, line 51, before "illustrates", insert --and--. Column 4, line 55, after "slidably", insert --receives--. Column 7, line 22, "stipper" should read --stripper--.

In the claims, Claim 2, line 9, after "set", insert --forth--. Claim 4, line 44, "9" should read --2--.

Signed and Sealed this

*Twenty-first* Day of *February 1978*

[SEAL]

*Attest:*

RUTH C. MASON
*Attesting Officer*

LUTRELLE F. PARKER
*Acting Commissioner of Patents and Trademarks*